United States Patent
Kalthoff et al.

(10) Patent No.: US 6,404,376 B1
(45) Date of Patent: Jun. 11, 2002

(54) CAPACITOR ARRAY HAVING REDUCED VOLTAGE COEFFICIENT INDUCED NON-LINEARITIES

(75) Inventors: Timothy V. Kalthoff; Bernd M. Rundel, both of Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/607,475

(22) Filed: Jun. 30, 2000

Related U.S. Application Data
(60) Provisional application No. 60/141,992, filed on Jul. 1, 1999.

(51) Int. Cl.[7] .................................. H03M 1/00
(52) U.S. Cl. ........................................ 341/172; 341/150
(58) Field of Search .................................. 341/150, 172

(56) References Cited

U.S. PATENT DOCUMENTS

| | | |
|---|---|---|
| 3,787,740 A | 1/1974 | Salton et al. |
| 4,458,237 A | 7/1984 | Domogalla |
| 4,668,936 A | 5/1987 | Newcomb et al. |
| 4,799,042 A | 1/1989 | Confalonieri et al. |
| 4,853,698 A | 8/1989 | Roessler |
| 4,878,151 A | 10/1989 | Gallichio |
| 4,918,454 A | 4/1990 | Early et al. |
| 4,999,633 A | 3/1991 | Draxelmayr |
| 5,208,597 A * | 5/1993 | Early et al. ................ 341/172 |
| 5,703,589 A | 12/1997 | Kalthoff et al. |
| 5,719,576 A * | 2/1998 | Draxelmayr ............... 341/150 |
| 5,852,415 A | 12/1998 | Cotter et al. |
| 6,194,946 B1 * | 2/2001 | Fowers ...................... 327/337 |

OTHER PUBLICATIONS

Hester, R.K. et al., Fully Differential ADC with Rail-to-Rail Common-Mode Range and Nonlinear Capacitor Compensation, IEEE Jounal of Solid-State Circuits, vol. 25, No. 1, Feb. 1990, pp. 173-183.*

* cited by examiner

*Primary Examiner*—Howard L. Williams
(74) *Attorney, Agent, or Firm*—W. Daniel Swayze, Jr.; W. James Brady; Frederick J. Telecky, Jr.

(57) ABSTRACT

A capacitor array is configured to negate or cancel the voltage coefficient of the capacitors within the array, and thus reduce and/or eliminate the voltage coefficient non-linearities present within the A/D converter. In the capacitor array, a first capacitor is suitably configured with at least one additional capacitor in the array such that the charge across the array is linear with respect to an input voltage applied to the input of the array. In addition, the voltage coefficient non-linearities of the first capacitor can be suitably canceled by the inverse voltage coefficient non-linearities of any additional capacitors within the balance of the array, thereby reducing the potential for non-linearities within the A/D converter.

18 Claims, 5 Drawing Sheets

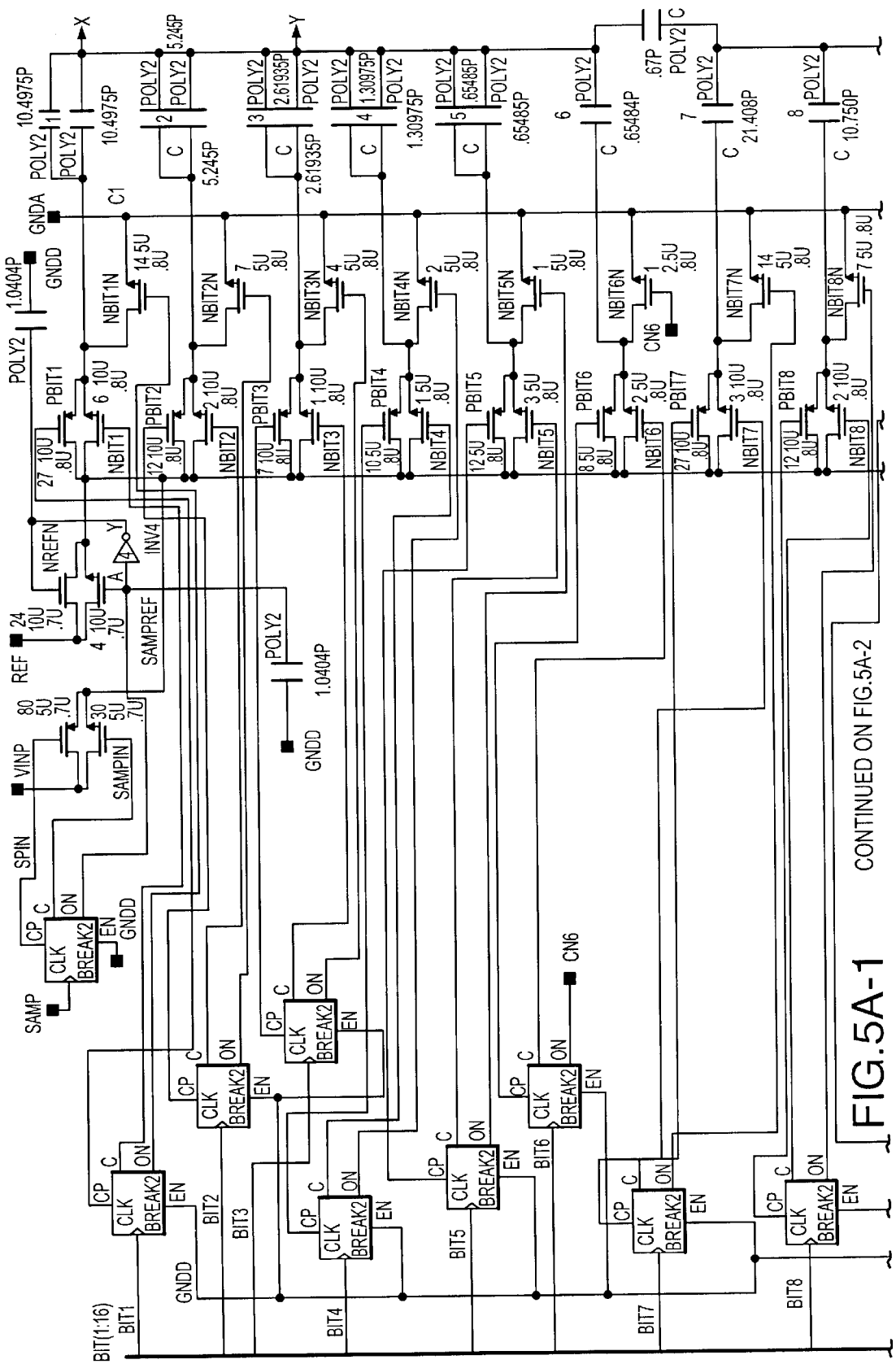
FIG.5A-1 CONTINUED ON FIG.5A-2

CAPACITOR ARRAY HAVING REDUCED VOLTAGE COEFFICIENT INDUCED NON-LINEARITIES

CROSS-REFERENCE TO RELATED APPLICATIONS

This application claims priority of prior now abandoned U.S. Provisional Application No. 60/141,992, filed Jul. 1, 1999.

FIELD OF THE INVENTION

The present invention relates to a capacitor array for use within an analog-to-digital converter. More particularly, the present invention relates to a capacitor array configured to reduce and/or eliminate the non-linearities within an analog-to-digital converter that may be created by the voltage coefficient of the capacitors utilized therewithin.

BACKGROUND OF THE INVENTION

Resistor networks have been used for sampling methodologies of analog-to-digital converters. Over the past several years, Complementary Metallic Oxide Semiconductor (CMOS) integrated circuit technology is becoming more commonplace with A/D converters in that the CMOS technology is relatively inexpensive and yet versatile in allowing designers to include digital logic circuitry and analog circuitry in the same integrated circuit.

As the requirements for precision have continued to increase with respect to analog-to-digital (A/D) converters, the use of resistor networks for sampling has been substantially reduced due to the difficulty in producing accurate resistors using CMOS technology. Instead, the technique of charge redistribution, which utilizes capacitor networks instead of resistor networks, has become the most commonly used methodology in CMOS analog-to-digital converters. Despite the resulting improvement, the demands on designers for further improvements in the precision for capacitive charge redistribution techniques continues to increase as well.

An exemplary A/D converter which employs capacitive charge redistribution is discussed more fully in U.S. Pat. No. 5,852,415, issued on Dec. 22, 1998 to Cotter et al. The six-bit converter disclosed therein generally comprises an array of binary-weighted capacitors configured with a comparator circuit, together with a series of switches which purport to enable sampling by the A/D converter. In that A/D converter, for example, one switch is configured to connect a common terminal of the capacitors to ground while another series of switches are configured for selectively connecting the other terminal of the capacitors to ground, to an input voltage, Vin, or to a reference voltage, Vref. During operation, that A/D converter samples the input voltage by charging up the capacitor array to the input voltage, Vin, during a sampling step. Next, the A/D converter redistributes this charge on the capacitors to the input of the comparator circuit during a holding step. Finally, during a charge redistribution step, the A/D converter selectively compares the voltage at the comparator circuit to the reference voltage to iteratively derive a digital representation of the analog input voltage, Vin.

Unfortunately, with respect to the Cotter et al. design, as the input voltage changes, the value of the capacitance also changes, thus resulting in non-linearities within the A/D converter. Specifically, the voltage coefficient of capacitance, namely the rate of fractional change in capacitance as a function of the change in voltage, tends to create a non-linear charge on the capacitors within the array. These voltage coefficient non-linearities generally result from, interalia, processing variations in the doping levels of the capacitors during manufacture. Moreover, the size of the depletion regions within the capacitors can be significantly affected depending on manufacturing techniques. Accordingly, these voltage-coefficient non-linearity characteristics can be more problematic to the A/D converter, and particularly those A/D converters which use polypoly-type capacitors.

Some manufacturing approaches directed to reducing the non-linearities resulting from the voltage coefficient of capacitance within A/D converters have employed metal oxide capacitors due to their minimal depletion region and low or essentially non-existent voltage coefficient. However, such capacitors are larger in area, e.g., often 2 or more times larger than low cost, production level, polypoly-type capacitors, and thus require a larger layout area. Further, these metal oxide capacitors can be more difficult to manufacture, such as by requiring additional critical metallurgical steps, and thus can be very expensive to produce.

Other manufacturing approaches directed to reducing the non-linearities resulting from voltage coefficient of capacitors have included the precise controlling and matching of the doping levels on the capacitors in an attempt minimize the depletion region of the involved capacitors. However, such doping techniques can significantly increase the manufacturing costs of the capacitors. Moreover, such doping techniques are not able to reduce the non-linearities within the capacitor array to the standards expected to be required in the future for precision and accuracy in A/D converters, e.g. to errors of less than 1 LSB.

Another approach for minimizing the impact on linearity created by voltage coefficients in capacitors is disclosed more fully in U.S. Pat. No. 4,878,151 issued to Gallichio on Oct. 31, 1989, and which describes an "anti-parallel" capacitor arrangement having two capacitors connected such that the polarity of one capacitor is connected to the reverse polarity of the other capacitor. Gallichio states that the change in capacitance of each capacitor as the input voltage is varied cancels out the linear variation in the capacitance of each capacitor due to the reverse polarity of the two capacitors.

Further, U.S. Pat. No. 4,918,454, issued on Apr. 17, 1990 to Early et al., discloses that if two capacitors are combined in parallel, one with a negative voltage across and the other with a positive voltage across, the dominant first order coefficient, i.e., the first order coefficient in a Taylor series expansion of the voltage coefficient for a given capacitance, and which corresponds to the dominant non-linearity of the capacitor, can be canceled out. In general, this Taylor series expansion can be expressed as:

$$C = C_{NOMINAL} + K_1 V + K_2 V^2 + \ldots$$

Thus, in addition to the dominant first order capacitive voltage coefficient, $K_1$, there also exists second order, $K_2$, third order, $K_1$, etc., coefficients which also must be addressed to have a perfectly linear capacitor.

With reference to FIG. 1, a schematic representation of the anti-parallel configuration, and with reference to FIG. 2, a cross-sectional diagram of an anti-parallel configuration, each as disclosed by Early et al. are shown. As shown, Early et al. discloses an anti-parallel configuration in which two capacitors 28 and 30, are directly connected with their polarity reversed with respect to each other to provide a single capacitor component having a low voltage coefficient.

Unfortunately, the implementation of the capacitor component disclosed in Early et al. into an array of capacitors for charge redistribution, with each capacitor component within the array comprising at least two capacitors configured in an "anti-parallel" manner, i.e., the polarity of each capacitor within the capacitor component alternating from positive to negative, would have its disadvantages. As one will appreciate, such a configuration and interconnection process would require a sizable layout area when producing such an array arrangement. Moreover, such an interconnection process could prove to be quite complicated during manufacture. For example, the requirements for the layout area would be greatly increased due to the need for excess space to provide the interconnections from the top plate of one capacitor to the bottom plate of another adjacent capacitor. Another disadvantage is that an array of capacitor components comprising capacitors successively configured in an anti-parallel manner could introduce coupling effects into the capacitive network of the A/D circuit. These coupling effects, which result from the effects of the plurality of crossing interconnections, would lead to crosstalk, dynamic switching errors, and dc accuracy problems. Accordingly, the manufacturing costs and complexity would be increased for such a capacitor array comprising a plurality of anti-parallel capacitors within an A/D converter.

Accordingly, a need exists for a capacitor array which overcomes the above described problems with prior art A/D converters. In particular, a need exists for a capacitor array configured to reduce and/or eliminate the voltage coefficient non-linearities present within an A/D converter, without complicating the manufacturing and layout requirements for the A/D converter. Further, a need exists for a method for negating the voltage coefficient of the capacitors as used within an A/D converter to facilitate minimal linearity errors of less than 1 LSB.

SUMMARY OF THE INVENTION

A capacitor array in accordance with the present invention addresses many of the shortcomings of the prior art. In accordance with one aspect of the present invention, the capacitor array is configured to negate or cancel the influence of the voltage coefficient of the capacitors within the array, and thus reduce and or eliminate the voltage coefficient related non-linearities present within the A/D converter. In accordance with an exemplary embodiment, a first capacitor within the array is suitably configured with at least one additional capacitor in the array such that the charge across the array is linear with respect to an input voltage applied to the input of the array. In addition, the voltage coefficient induced non-linearities from the first capacitor can be suitably canceled by the inverse voltage coefficient induced non-linearities of any additional capacitors within the balance of the array, thereby reducing the potential for non-linearities within the A/D converter.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various hardware components and processing steps. It should be appreciated that such components may be realized by any number of hardware components configured to perform the specified functions. For example, the present invention may employ various integrated circuit components, e.g., transistors, memory elements, digital signal processing elements, integrators, and the like, which may carry out a variety of functions under the control of one or more microprocessors or other control devices. In addition, those skilled in the art will appreciate that the present invention may be practiced in any number of conversion contexts and that the exemplary embodiment described herein is merely one exemplary application for the invention. Moreover, with respect to various embodiments, many devices will be described as either connected or coupled to another device. It should be noted that such connections can be facilitated by direct connection to another device, or by connection through another device, such as, for example, a gain block or other functional component. Further, it should be noted that the present invention may employ any number of conventional techniques for filtering, signal processing and conditioning, and the like. Such general techniques that may be known to those skilled in the art are not described in detail herein.

As discussed above, a need exists for a capacitor array that can reduce and/or eliminate the voltage coefficient non-linearities, and yet is easier to manufacture and can utilize low cost, production level capacitors. In accordance with the present invention, a capacitor array is suitably configured to cancel out the dominant voltage coefficient non-linearities present in the capacitors to prevent the capacitor array from detrimentally affecting the integrated circuit device in which it operates.

Figure 1:
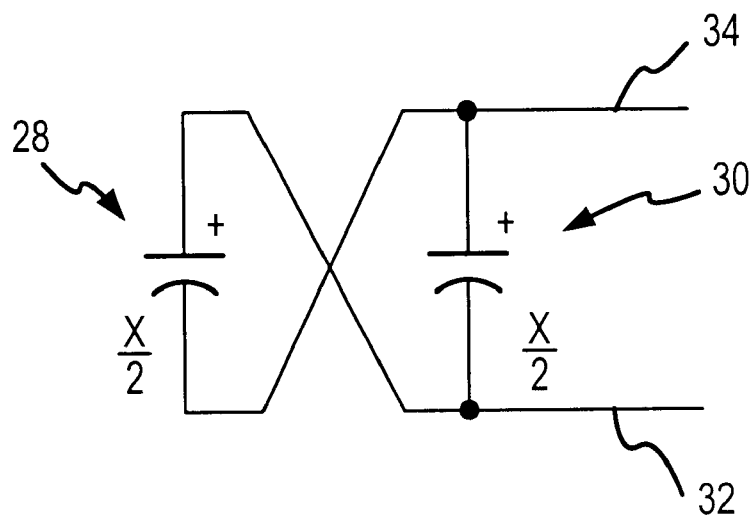
FIG. 1 is a schematic representation of an exemplary anti-parallel configuration of the prior art.
Figure 2:
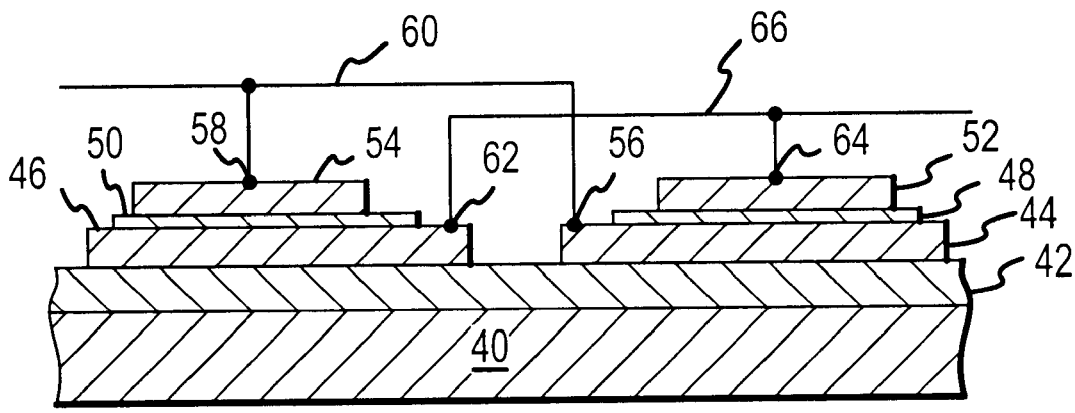
FIG. 2 is a cross-sectional diagram of an anti-parallel configuration of the prior art.
Figure 3:
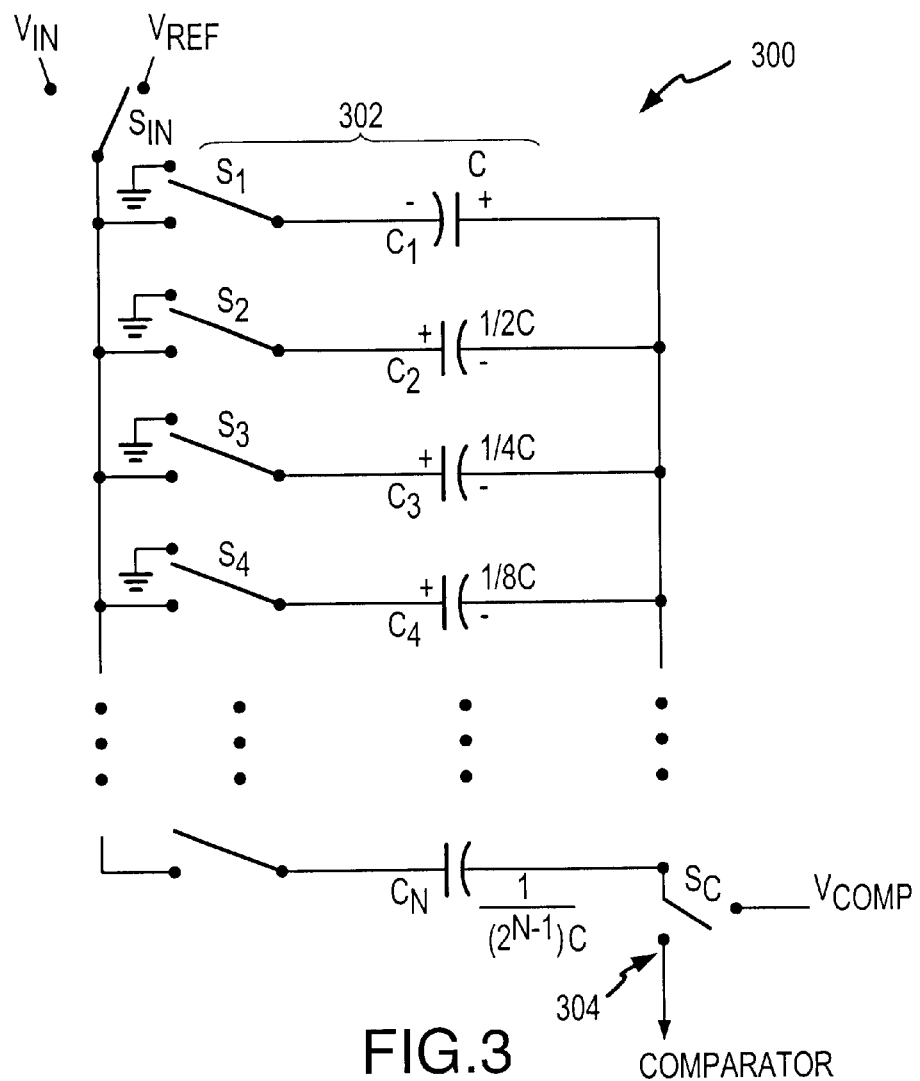
FIG. 3 illustrates a schematic representation of an exemplary embodiment of a capacitor array in accordance with the present invention.

In accordance with an exemplary embodiment, with reference to FIG. 3, a capacitor array circuit 300, as may be used with an A/D converter, is illustrated. In accordance with this exemplary embodiment, capacitor array circuit 300 suitably comprises three voltage sources, an input voltage $V_{IN}$, a reference voltage $V_{REF}$, and a comparison voltage $V_{COMP}$, an input switch, $S_{IN}$, a comparator switch, $S_C$, and a capacitor array network 302. Comparison voltage $V_{COMP}$ suitably comprises a comparison reference for a comparator device during the conversion process. In addition, comparison voltage $V_{COMP}$ can comprise a positive or negative voltage reference, or can be suitably connected to ground. Input switch $S_{IN}$ and comparator switch, $S_C$ can comprise any device for switching analog signals, such as, for example, transistor devices, or any other device hereinafter devised.

Capacitor array network 302 preferably comprises an array of capacitors, $C_1$–$C_N$, with each such capacitor having a corresponding reference switch, $S_1$–$S_N$. Like switches $S_C$ and $S_{IN}$, reference switches $S_1$–$S_N$ can comprise any device for switching analog signals, now known or hereinafter devised. Preferably, switches $S_1$–$S_N$ suitably comprise transistor devices, e.g, CMOS transistors configured in PMOS and/or NMOS arrangements.

In accordance with an exemplary embodiment of the present invention, capacitor $C_1$, which suitably represents the most significant bit "MSB", is suitably configured such that its top plate, also referred to as its positive terminal, is connected to comparator switch $S_C$, while the remaining capacitors $C_2$–$C_N$ are suitably configured such that their bottom plates, also referred to as their negative terminals, are connected to comparator switch $S_C$. It should be noted, however, that the use of the terms "positive terminal" and "negative terminal" are for the purposes of a naming convention for illustration and do not necessarily imply a particular polarity or voltage potential across the capacitors $C_2$–$C_N$.

Continuing in accordance with this exemplary embodiment of the present invention, capacitor $C_1$ is suitably configured such that its bottom plate, i.e., its negative terminal, is connected to its corresponding reference switch $S_1$, while the remaining capacitors $C_2$–$C_N$ are suitably configured such that their top plates, i.e., their positive terminals, are connected to their corresponding references switches $S_2$–$S_N$. However, it should be noted that the connection of capacitors $C_1$–$C_N$ could be suitably reversed in polarity in accordance with other embodiments of the present invention. For example, capacitor $C_1$ could have its positive terminal connected to reference switch $S_1$, while capacitors $C_2$–$C_N$ could have their positive terminals connected to comparator switch $S_C$.

Although capacitors $C_1$ and $C_2$–$C_N$ do not comprise individual or multiple capacitors configured in an "anti-parallel" manner, it has been discovered that the present configuration tends to negate the dominant first-order non-linearities, as well as any other odd-order non-linearities, caused by the voltage coefficients influences of the capacitors. In effect, capacitor $C_1$ within the array is suitably configured with capacitors $C_2$–$C_N$ in the array such that the charge across the array is linear with respect to an input voltage applied to the input of the array. Accordingly, the voltage coefficients of the capacitors are reduced, i.e., the dominant first-order non-linearities may be effectively canceled within the capacitor array, and thus the performance of the A/D converter is improved. As a result, such a capacitor array realizes an improved linearity of approximately 2–3 times over prior art capacitor arrays, with the distortion improving by an average of 6–9 dB.

However, in addition to the above improvements, it should also be noted that the interconnection process for the capacitor array of the present invention is much simpler than an array of capacitors comprised of separate anti-parallel capacitors, i.e., simpler than array wherein each such capacitor in the array would comprise at least two capacitors configured in an "anti-parallel" manner. Moreover, the layout area required for the capacitor array of the present invention has been significantly reduced from an array configuration of individual, anti-parallel capacitors. Still further, although the capacitors as utilized in the capacitor array in accordance with an exemplary embodiment of the present invention can be highly doped, the configuration of the capacitor array of the present invention permits even production level, low cost capacitors to be utilized as well.

In accordance with another aspect of the present invention, capacitor array 302 suitably comprises a N-bit array configuration to facilitate analog-to-digital conversion. Accordingly, capacitor array 302 can also be expanded to include smaller arrays, e.g., 2-bit arrays, or larger arrays, e.g., 32-bit or larger arrays, as well as any configuration in between. In accordance with an exemplary embodiment, capacitor array 302 comprises a 16-bit array.

In addition, in accordance with an exemplary embodiment, capacitor array 302 suitably comprises an array of binary weighted capacitors. For example, if the capacitance value of $C_1$ is C, then the capacitance value of $C_2$ is ½C, the capacitance value of $C_3$ is ¼C, and so on, such that the capacitance value of $C_N$ is $1/(2^{N-1})$C. As a more specific example, in a 16-bit array, if the capacitance value of $C_1$ is C, then the capacitance value of $C_{16}$ is $\frac{1}{2}^{15}$ C, i.e., the capacitance value of $C_{16}$ is $3.05^{-5}$ C.

Figure 4:
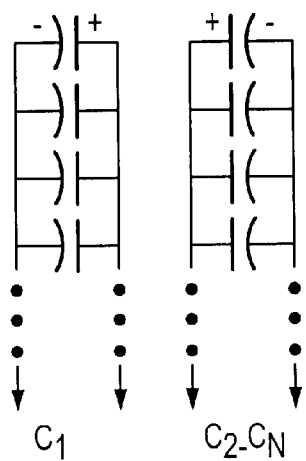
FIG. 4 illustrates a schematic representation of a capacitor arrangement in accordance with one aspect of the present invention.

In addition, prior art capacitor arrays as used in many A/D converters often have difficulty in matching their desired capacitance values, and in particular those A/D converters employing a binary weighted capacitor scheme. Typically, this capacitance matching problem is a result of process variations during manufacture of capacitors which may cause underage and overage of the capacitor values within the capacitor arrays. In accordance with another aspect of the present invention, although each capacitor $C_1$–$C_N$ can comprise a single capacitor, each capacitor $C_1$–$C_N$ can also be comprised of a plurality of smaller capacitors. However, unlike the capacitor taught by Early et al., the plurality of smaller capacitors comprising each capacitor $C_1$–$C_N$ are configured in a parallel manner, rather than an "anti-parallel" manner. With reference to FIG. 4, in accordance with this aspect, any one of capacitor components $C_1$–$C_N$ can comprise a plurality of capacitors configured in a parallel manner to provide a desired capacitance value.

In addition, the plurality of capacitors comprising each capacitor $C_1$–$C_N$ can be configured in various manners to provide a capacitor having a capacitance value of $C_N$ equal to $1/(2^{N-1})$C. For example, in a case where equal value capacitors are utilized to provide capacitor components $C_1$–$C_N$, capacitor component $C_1$ can comprise 32 smaller equal value capacitors configured in parallel, capacitor component $C_2$ can comprise 16 of the smaller equal value capacitors, and capacitor component $C_3$ can comprise 8 of the smaller equal value capacitors, and so on. However, it should also be noted that each of capacitors $C_1$–$C_N$ could also comprise a plurality of capacitors of unequal values, and that the capacitors can be suitably configured in a series or a series/parallel combination such that the capacitance value for any capacitor component $C_1$–$C_N$ is a function of $1/(2^{N-1})$C.

Having generally described a capacitor array circuit 300 as may be used with an A/D converter in accordance with an exemplary embodiment, the operation of a capacitor array circuit 300 configured to perform an N-bit analog-to-digital conversion by measuring an analog voltage and converting the analog voltage to a corresponding N-bit digital word will now be described. In accordance with this aspect, capacitor array circuit 300 is configured to switch between three modes, such as a sampling mode, a holding mode and a conversion mode.

In the sampling mode, switch $S_{IN}$ is suitably connected to receive the analog input voltage $V_{IN}$, and switches $S_1$ through $S_N$ are suitably closed such that capacitors $C_1$ through $C_N$ are connected to the input voltage $V_{IN}$ through a first terminal, with the second terminal of each of the capacitors $C_1$–$C_N$ connected to $V_{COMP}$ by switch $S_C$. At the end of the sampling mode, capacitors $C_1$–$C_N$ collectively store a charge proportional to the input voltage, $V_{IN}$. Moreover, as a result of the configuration of capacitor $C_1$ with respect to capacitors $C_2$–$C_N$ as discussed above, the charge across capacitors $C_1$–$C_N$ is linear with respect to input voltage, $V_{IN}$, in spite of dominant first order voltage coefficients within capacitors $C_1$–$C_N$.

In the hold mode, ground switch $S_C$ preferably switches from $V_{COMP}$ to an input comparison device, such as a comparator. Thereafter, switch $S_1$ suitably opens. Meanwhile, reference switches $S_2$–$S_N$ suitably switch from the voltages sources to ground. However, switch $S_1$ remains closed. Finally, input switch $S_{IN}$ suitably selects the reference voltage, $V_{REF}$. Accordingly, capacitor $C_1$, which represents the most significant bit or "MSB" of the array, is connected to the reference voltage $V_{REF}$.

In the conversion mode in which charge redistribution occurs, each of the capacitors $C_1$–$C_N$ are suitably connected in a sequential process to the reference voltage $V_{REF}$. Here, capacitors $C_2$–$C_N$ are sequentially disconnected on the first terminal from ground and are switched to the reference voltage $V_{REF}$, while continuing to be coupled to the comparator on the second terminal. Accordingly, capacitor array circuit 300 sequentially derives an output digital word bit-by-bit by doing a comparison between a summing node 304 and $V_{COMP}$, as the switches $S_2$–$S_N$ are toggled between ground and the reference voltage, $V_{REF}$. For example, with respect to capacitor $C_1$, if the comparator detects at summing node 304 a voltage above $V_{COMP}$, the bit corresponding to capacitor $C_1$, i.e, the MSB, is set to a digital "zero" value, and switch $S_1$ is suitably switched to ground. On the other hand, if the comparator detects a voltage below $V_{COMP}$, the bit corresponding to capacitor $C_1$ is set to a digital "one" value, and switch $S_1$ remains suitably connected to the reference voltage, $V_{REF}$. Thereafter, capacitor array circuit 300 repeats this sequence separately for each capacitor $C_2$–$C_N$, i.e., reference switch $S_2$ switches from ground to the reference voltage, $V_{REF}$, the comparison is made between summing node 304 and $V_{COMP}$, a decision is made as to the position to leave switch $S_2$, and the sequence is continued.

Accordingly, as a result of the sampling, holding and conversion modes described above, the position of switches $S_1$–$S_N$ of capacitor array 300 are representative of an N-bit digital word that is representative of the input voltage $V_{IN}$. Once the conversion into the N-bit digital word has taken place, the entire three-mode conversion process can then start again with the sampling step of a new input voltage value for $V_{IN}$. However, as a result of the configuration of capacitor $C_1$ with respect to capacitors $C_2$–$C_N$ of capacitor array 302, the dominant voltage coefficient non-linearities are substantially eliminated during operation.

This ability to cancel out the dominant voltage coefficient non-linearities results from the binary weighted scheme for the capacitors which provides that the weight of capacitor $C_1$ is suitably balanced against its weight in sum of the capacitors it is trying to negate, e.g., capacitors $C_2$–$C_N$. For example, if capacitor $C_1$ has a weight of 32C, capacitor $C_2$ has a weight of 16C, and so on, such that capacitor $C_N$ has a weight of $1/(2^{N-1})$C, the weight of capacitor $C_1$ suitably balances out the weight in sum of capacitors $C_2$–$C_N$. Preferably, this cancellation suitably occurs during the sampling step, wherein reference-switches $S_1$–$S_N$ are suitably connected to the input voltage $V_{IN}$.

Figures 2, 5A:
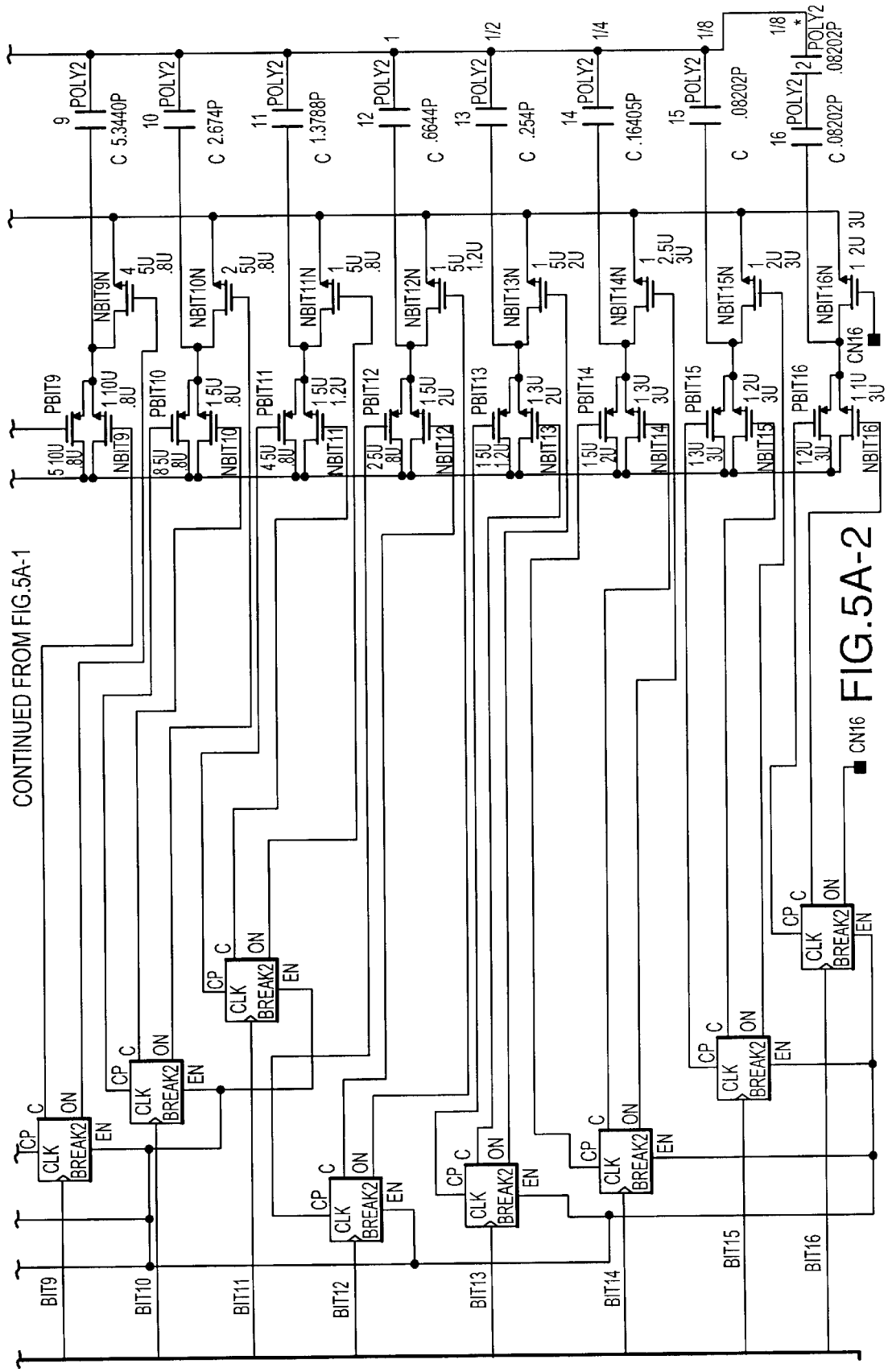
FIGS. 5A and 5B illustrate a schematic representation of another exemplary embodiment of a capacitive array in accordance with the present invention.
Figure 5B:
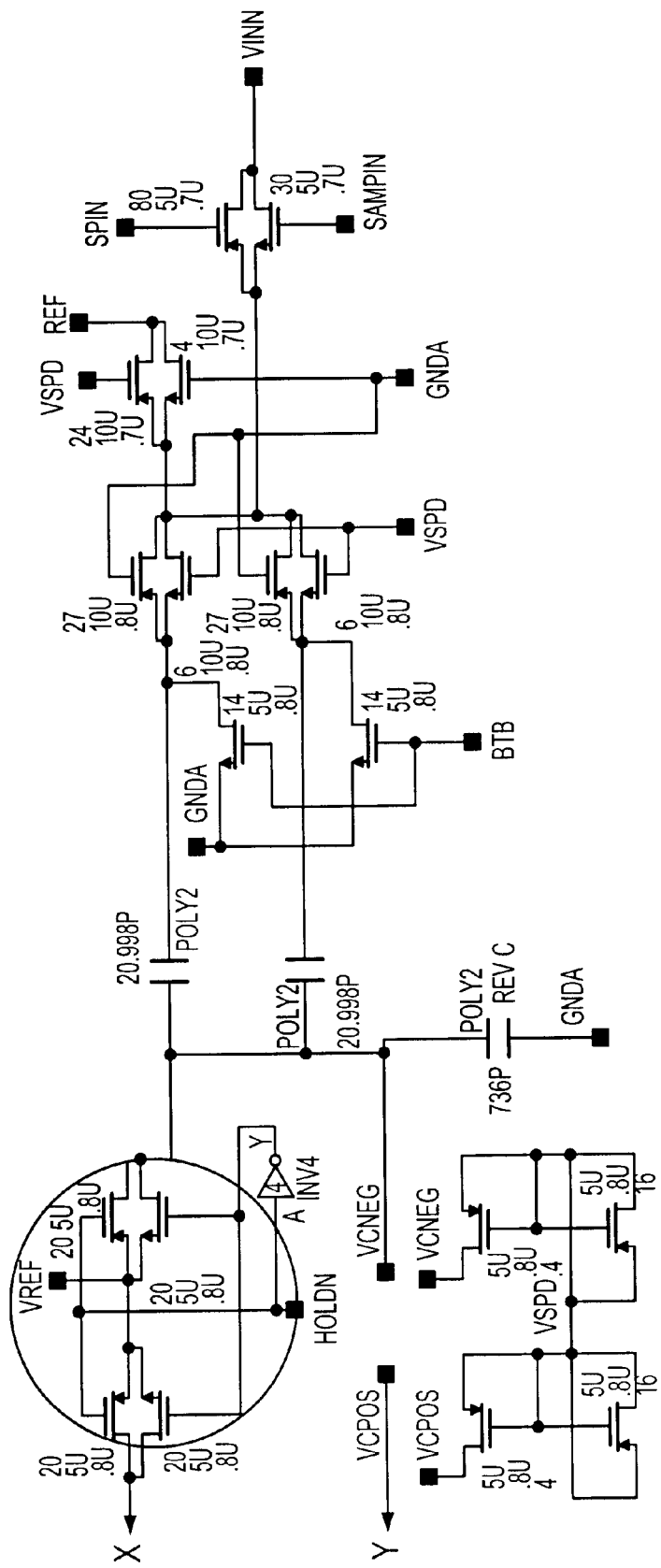

Without limiting generally the foregoing, a more detailed exemplary embodiment comprising a 16-bit capacitor array circuit 500 for an A/D converter is illustrated with reference to FIGS. 5A and 5B. In this exemplary embodiment, capacitor array circuit 500 suitably comprises an array of capacitors, $C_1$–$C_{16}$, with each such capacitor having a corresponding reference switch, $S_1$–$S_{16}$, suitably configured as described above. Moreover, capacitors $C_1$–$C_{16}$ are configured in a binary-weighted manner, i.e., the effective capacitance value of capacitor $C_N$ is $1/(2^{N-1})$C. In accordance with a preferred embodiment, capacitor $C_6$ comprises a single capacitor having a capacitance value between 0.1 and 2.0 pF, e.g., a 0.65484 pF value capacitor. In addition, each preceding capacitor component $C_5$–$C_1$ comprises a capacitance value twice as great as the subsequent capacitor in the array. For example, capacitor $C_5$ can comprise two similarly sized capacitors as capacitor $C_6$, capacitor $C_4$ comprises 4 similarly sized capacitors as capacitor $C_6$, and so on such that capacitor $C_1$ comprises 32 capacitors having a similar capacitance value as capacitor $C_6$, i.e., capacitors $C_1$–$C_N$ comprise binary weighted unit values. However, $C_1$–$C_N$ need not comprise binary weighted unit values, and can comprise a single capacitor configuration, or any other number of capacitors such that each capacitor $C_N$ has a capacitance value of $1/(2^{N-1})$C.

As discussed above, to completely cancel out all the odd-order voltage coefficient errors present within the array, a complete matching of the capacitor array weighted values would be provided. However, in that the weight of capacitor $C_1$, for example 32C, substantially matches the weighted sum of capacitors $C_2$–$C_N$, which have a weighted sum, for example, of $16+8+4+\ldots 1/(2^{N-1})$C, complete 100% matching may not be easily attainable without further modifications. However, cancellation of the first order dominant non-linearities may only provide benefits to the capacitor array after 90% matching, i.e., the second order non-linearities can begin to dominate at approximately 90% matching and higher, in many embodiments. Accordingly, in an exemplary embodiment, modest cancellation, for example, cancellation of the odd order voltage coefficients greater than 90%, and preferably approximating 97% is provided.

Continuing with this embodiment, capacitor array circuit 500 can also include a scaling down step for scaling down the effective charge on any subsequent capacitors within an array. For example, the scaling down step may comprise the implementation of a capacitor $C_S$ preferably configured to scale down the value of successive capacitors, such as, for example, capacitor $C_7$, to have an effective capacitance value of ½ of capacitor $C_6$. Preferably, capacitor $C_S$ is configured in series between capacitor $C_6$ and capacitor $C_7$. In a preferred embodiment, capacitor $C_S$ comprises a 0.67 pF capacitor, but may comprise various other capacitance values as well. In accordance with this embodiment, with scaling down capacitor $C_S$ preferably configured to scale down the value of successive capacitors, such as, for example, capacitor $C_7$, the weight of capacitor $C_1$ will be balanced against the weighted sum of capacitors $C_2$ $C_6$. In addition, it should be noted that the scaling down step may include the reduction of the reference voltage $V_{REF}$ seen by a subsequent capacitor, e.g., $C_7$, to effective scale down the effective charge on capacitors $C_7$–$C_N$.

In addition, capacitors $C_{12}$–$C_7$ are configured in a manner similar to capacitors $C_6$–$C_1$. Stated another way, capacitor $C_{12}$ may comprise a single capacitor, e.g., a 0.6644 pF value capacitor, with each preceding capacitor $C_{11}$–$C_7$ comprising, for example, twice the number of capacitors of the subsequent capacitor in the array such that capacitor $C_7$ comprises 32 equal value capacitors each of a similar capacitance value as capacitor $C_{12}$, or a single capacitor configuration or any other number of capacitors such that each capacitor $C_N$ has a capacitance value of $1/(2^{N-1})$C.

While the exemplary embodiment illustrates scaling down capacitor $C_S$ configured in series between capacitor $C_6$ and capacitor $C_7$, it should be noted that scaling down capacitor $C_S$ can be suitably configured anywhere in between capacitors $C_1$–$C_N$. Moreover, scaling down capacitor $C_S$ can also comprise multiple capacitors in a series, parallel, or series/parallel configuration.

With respect to capacitors $C_{13}$–$C_{16}$, although each capacitor could also comprise a plurality of capacitors, in this embodiment capacitors $C_{13}$–$C_{16}$ comprise single capacitors, e.g., capacitor $C_{15}$ comprises a single capacitor having a value ⅛ of the value of capacitor $C_{12}$. Although not shown, capacitor array circuit 500 could also comprise a second scaling down capacitor $C_{S2}$ configured between capacitors $C_{12}$ and $C_{13}$ to suitably scale down the value of capacitors $C_{13}$–$C_{16}$. Moreover, additional scaling down capacitors $C_S$ may also be implemented in between capacitors $C_1$–$C_N$.

The present invention has been described above with reference to various exemplary embodiments. However, those skilled in the art will recognize that changes and modifications may be made to the exemplary embodiments without departing from the scope of the present invention. For example, the various components of the capacitor array may be implemented in alternate ways depending upon the particular application or in consideration of any number of cost functions associated with the operation of the system, e.g., the capacitors or switches may be laid out in different sequences or in different areas of an integrated circuit. In addition, the techniques described herein may be extended or modified for use with various other applications, such as, for example, a digital-to-analog (D/A) converter. These and other changes or modifications are intended to be included within the scope of the present invention.

We claim:

1. A capacitor array configured for minimizing the voltage coefficient non-linearities within an integrated circuit, said capacitor array comprising:
    a first capacitor having a first polarity and a first weighted value; and
    at least one other capacitor having a second polarity and a second weighted value, wherein said first capacitor is selectively coupled in parallel to said at least one other capacitor during sampling of an input voltage by the capacitor array, such that said first polarity of said first capacitor is reversed with respect to said second polarity of said at least one other capacitor; and
    wherein said first weighted value is balanced against said second weighted value to negate the dominant odd-order capacitive voltage coefficient non-linearities influences within the capacitor array.

2. A capacitor array according to claim 1, wherein said first capacitor and said at least one other capacitor are configured in a binary-weighted scheme.

3. A capacitor array according to claim 2, wherein said capacitor array further comprises a scaling down capacitor configured to adjust an equivalent capacitance of said at least one other capacitor.

4. A capacitor array for use within an analog-to-digital converter, said capacitor array comprising:
    a first capacitor component having a top plate and a bottom plate; and
    a plurality of other capacitor components, each of said plurality of other capacitor components having a top plate and a bottom plate, wherein said top plate of said first capacitor component is connected to said bottom plate of each of said plurality of other capacitor components, and said bottom plate of said first capacitor component is selectively connected to said top plate of each said plurality of other capacitor components during sampling of an input voltage by said capacitor array, and
    wherein errors produced by first order voltage coefficients of said first capacitor component and said plurality of other capacitor components within said capacitor array are canceled to reduce the non-linearities present within said analog-to-digital converter.

5. A capacitor array according to claim 4, wherein said first capacitor component and said plurality of other capacitor components each comprise a plurality of capacitors, wherein each capacitor of said plurality of capacitors is configured in parallel with other capacitors of said plurality of capacitors with identical polarity.

6. A capacitor array according to claim 4, wherein said capacitor array is configured in a binary-weighted scheme, wherein said bottom plate of said first capacitor is selectively connected through a first switch and a second switch to said top plate of each of said plurality of other capacitor components.

7. A sampling circuit for use within an analog-to-digital converter, said sampling circuit comprising:
    a pair of voltage terminals comprising a reference voltage terminal and an input voltage terminal;
    a plurality of switches comprising an input switch, a comparator switch, and a plurality of reference switches; and
    a plurality of capacitors configured in a parallel array, wherein only one of said plurality of capacitors is configured in a reverse polarity arrangement with any other capacitors of said plurality of capacitors to reduce the voltage coefficient non-linearities within said sampling circuit.

8. A sampling circuit according to claim 7, wherein said wherein said plurality of capacitors further comprises a scaling down capacitor configured to adjust the equivalent capacitance of said plurality of capacitors.

9. A capacitor array for use within an analog-to-digital converter, said capacitor array comprising:
    a first capacitor component; and
    at least two other capacitor components, wherein said first capacitor component is selectively configurable in a reverse polarity arrangement with said at least two other capacitor components such that a voltage charge across said capacitor array is linear with respect to an input voltage received by said capacitor array, and wherein odd-order voltage coefficient non-linearities of said capacitor array are canceled.

10. A capacitor array according to claim 9, wherein said first capacitor component and said at least two other capacitor components do not include an anti-parallel configuration of capacitors.

11. A capacitor array according to claim 9, wherein said capacitor array is configured in a binary weighted scheme, and said first capacitor component is configured in a reverse polarity arrangement with said at least two other capacitor components only during sampling of an input voltage.

12. A capacitor array according to claim 11, wherein said capacitor array further comprises a scaling down capacitor configured to adjust an equivalent capacitance of said at least two other capacitor components.

13. A capacitor array configured for minimizing the voltage coefficient non-linearities within an integrated circuit, said capacitor array comprising:
    a first capacitor having a first polarity; and
    a plurality of other capacitors having an identical second polarity, wherein said first capacitor is selectively coupled to at least one of said plurality of other capacitors during sampling of an input voltage by said capacitor array such that said first polarity of said first capacitor is reversed with respect to said identical second polarity of said plurality of other capacitors to reduce capacitive voltage coefficient non-linearities influences within said capacitor array.

14. The capacitor array according to claim 13, wherein said first capacitor is selectively coupled to said plurality of other capacitors such that said first capacitor and said plurality of other capacitors are not continuously coupled in an anti-parallel arrangement with said capacitor array.

15. The capacitor array according to claim 13, wherein said first capacitor has a first weighted value and said plurality of other capacitors have a plurality of weighted values, and wherein said first weighted value is balanced against said plurality of weighted values to negate any dominant odd-order capacitive voltage coefficient non-linearities influences within said capacitor array.

16. The capacitor array according to claim 15, wherein said first weighted value is balanced against said plurality of weighted values to reduce by an order of magnitude any dominant odd-order capacitive voltage coefficients.

17. The capacitor array according to claim 13, wherein said first capacitor is coupled to said plurality of other capacitors through a plurality of reference switches, said plurality of reference switches configured to be closed only during sampling of an input voltage by said capacitor array.

18. A capacitor array configured for minimizing the voltage coefficient non-linearities within an integrated circuit, said capacitor array comprising:

a first capacitor having a first weighted value; and a plurality of other capacitors having a plurality of other weighted values, said first capacitor being selectively coupled during sampling to at least one of said plurality of other capacitors such that said first capacitor and said plurality of other capacitors are not continuously coupled in an anti-parallel arrangement with said capacitor array; and wherein said first weighted value is balanced against at least one of said plurality of other weighted values to negate the dominant odd-order capacitive voltage coefficient non-linearities influences within said capacitor array.

* * * * *